(12) United States Patent
Zhang et al.

(10) Patent No.: US 10,854,526 B2
(45) Date of Patent: Dec. 1, 2020

(54) CHIP PACKAGING STRUCTURE, CHIP MODULE AND ELECTRONIC TERMINAL

(71) Applicant: SHENZHEN GOODIX TECHNOLOGY CO., LTD., Shenzhen (CN)

(72) Inventors: Shengbin Zhang, Shenzhen (CN); Kai Liu, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 134 days.

(21) Appl. No.: 16/136,231

(22) Filed: Sep. 19, 2018

(65) Prior Publication Data

US 2019/0027415 A1  Jan. 24, 2019

Related U.S. Application Data

(63) Continuation of application No. PCT/CN2017/093612, filed on Jul. 20, 2017.

(51) Int. Cl.
  *H01L 23/31* (2006.01)
  *H01L 23/00* (2006.01)
  (Continued)

(52) U.S. Cl.
  CPC .......... *H01L 23/3121* (2013.01); *H01L 23/13* (2013.01); *H01L 24/32* (2013.01); *H01L 24/48* (2013.01); *H01L 24/73* (2013.01); *H01L 24/92* (2013.01); *H01L 29/0657* (2013.01); *H01L 21/56* (2013.01); *H01L 23/293* (2013.01); *H01L 23/3128* (2013.01); *H01L 24/45* (2013.01); *H01L 2224/04042* (2013.01); *H01L 2224/12105* (2013.01); *H01L 2224/2919* (2013.01); *H01L 2224/32155* (2013.01);
  (Continued)

(58) Field of Classification Search
  None
  See application file for complete search history.

(56) References Cited

U.S. PATENT DOCUMENTS 5,969,951 A † 10/1999 Fischer
8,717,775 B1 † 5/2014 Bolognia
(Continued)

FOREIGN PATENT DOCUMENTS

CN  103325757 A  9/2013
CN  106158772 A  11/2016
(Continued)

*Primary Examiner* — Alexander G Ghyka (57) ABSTRACT

Embodiments of the present application provide the chip packaging structure, the chip module and the electronic terminal. In the chip packaging structure, the chip is accommodated in the trench of the substrate to decrease the thickness and volume of the chip packaging structure; and the plastic package is provided on the surface of the substrate on which the chip is disposed to plastically package the chip, which not only ensures the structural strength of the chip packaging structure, but also reduces the warpage that may be caused due to the decrease of the thickness of the chip packaging structure as much as possible. In addition, the surface of the plastic package is treated to be a flat surface, such that the chip module has good flatness and the adaptability of the chip module is improved.

8 Claims, 2 Drawing Sheets

(51) Int. Cl.
*H01L 23/13* (2006.01)
*H01L 29/06* (2006.01)
*H01L 23/29* (2006.01)
*H01L 21/56* (2006.01)

(52) U.S. Cl.
CPC ............... *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/4824* (2013.01); *H01L 2224/4826* (2013.01); *H01L 2224/48101* (2013.01); *H01L 2224/48105* (2013.01); *H01L 2224/73257* (2013.01); *H01L 2224/73267* (2013.01); *H01L 2224/73277* (2013.01); *H01L 2224/9222* (2013.01); *H01L 2924/10155* (2013.01); *H01L 2924/1576* (2013.01); *H01L 2924/15151* (2013.01); *H01L 2924/15153* (2013.01); *H01L 2924/15747* (2013.01); *H01L 2924/1815* (2013.01); *H01L 2924/3511* (2013.01)

(56) References Cited

U.S. PATENT DOCUMENTS

| | | |
|---|---|---|
| 2003/0090650 A1 | 5/2003 | Fujieda |
| 2006/0270109 A1 | 11/2006 | Blaszczak et al. |
| 2007/0246814 A1 | 10/2007 | Fan et al. |
| 2009/0166873 A1 | 7/2009 | Yang et al. |
| 2013/0285263 A1 | 10/2013 | Arnold et al. |
| 2015/0146944 A1 | 5/2015 | Pi et al. |
| 2018/0174018 A1 † | 6/2018 | Lundberg |

FOREIGN PATENT DOCUMENTS

| | | |
|---|---|---|
| CN | 106409690 A | 2/2017 |
| CN | 106531711 A | 3/2017 |
| CN | 106601628 A | 4/2017 |

† cited by third party

CHIP PACKAGING STRUCTURE, CHIP MODULE AND ELECTRONIC TERMINAL

CROSS-REFERENCE TO RELATED APPLICATIONS

The present application is a continuation of international application No. PCT/CN2017/093612 filed on Jul. 20, 2017, which is hereby incorporated by reference in its entirety.

TECHNICAL FIELD

The present application relates to the technical field of chip packaging, and in particular, relates to a chip packaging structure, a chip module and an electronic terminal.

BACKGROUND

With the constant development of mobile terminals into small size and ultra-small thickness, functional modules applied to the mobile terminals are also developing to be small-sized and thinner. For example, most mobile terminals are equipped with a chip packaging structure. By the chip packaging structure, the identity of a user is verified to start the mobile terminal.

However, the chip packaging structure having small size and thickness is easily subjected to warpage. Therefore, how to reduce the warpage of the chip packaging structure is a technical problem to be urgently solved.

SUMMARY

Embodiments of the present application are intended to provide a chip packaging structure, a chip module and an electronic terminal, to solve the above technical problems in the prior art.

A first aspect of embodiments of the present application provides a chip packaging structure. The chip packaging structure includes a substrate and a plastic package.

The substrate is provided with a trench, where the trench is configured to accommodate a chip.

The plastic package is configured to cover an upper surface of the substrate on which the chip is disposed, and an upper surface of the plastic package is a flat surface; or the plastic package is configured to cover a lower surface of the substrate on which the chip is disposed, and a lower surface of the plastic package is a flat surface.

Optionally, an upper surface of the chip and the upper surface of the substrate are in the same horizontal plane.

Optionally, a lower surface of the chip and the lower surface of the substrate are in the same horizontal plane.

Optionally, the substrate is further provided with a first electrical connection structure connected to a peripheral circuit, where the first electrical connection structure is configured to be electrically connected to a second electrical connection structure arranged on the chip.

Optionally, the first electrical connection structure is electrically connected to the second electrical connection structure on the chip that is disposed on a bottom of the trench.

Optionally, the first electrical connection structure is connected to the second electrical connection structure by wire bonding.

Optionally, the first electrical connection structure is electrically connected to a through silicon via arranged on the chip.

Optionally, the first electrical connection structure is a ball grid array.

Optionally, the plastic package is formed by an injected epoxy resin via a crosslinking curing reaction.

Optionally, the substrate is bonded to the accommodated chip via a bonding layer.

Optionally, the bonding layer is formed by an injected epoxy molding compound (EMC) via a crosslinking curing reaction.

Optionally, the substrate has a thickness of between 0.08 mm and 5 mm, inclusive.

A second aspect of embodiments of the present application provides a chip module. The chip module includes: a chip and the chip packaging structure according to the first aspect of embodiments of the present application; where the chip is accommodated in the trench on the substrate of the chip packaging structure.

A third aspect of embodiments of the present application provides an electronic terminal. The electronic terminal includes the chip module according to the second aspect of embodiments of the present application.

Embodiments of the present application provide the chip packaging structure, the chip module and the electronic terminal. In the chip packaging structure, the chip is accommodated in the trench on the substrate to decrease the thickness of the chip packaging structure and the packaging volume; and the plastic package is configured on the surface of the substrate on which the chip is disposed to plastically package the chip, which not only ensures the structural strength of the chip packaging structure, but also reduces the warpage that may be caused due to the decrease of the thickness of the chip packaging structure as much as possible. In addition, the surface of the plastic package is treated to be a flat surface, such that the chip module has good flatness and the adaptability of the chip module is improved.

BRIEF DESCRIPTION OF THE DRAWINGS

To more clearly describe technical solutions according to the embodiments of the present application, drawings that are to be referred for description of the embodiments or the prior art are briefly described hereinafter. Apparently, the drawings described hereinafter merely illustrate some embodiments of the present application. Persons of ordinary skill in the art may also derive other drawings based on the drawings described herein without any creative effort.

Reference numerals and denotations thereof:

| | |
|---|---|
| 1: Substrate | 2: Chip |
| 21: Trench | 3: Plastic package |
| 4: Wire | 5: Ball grid array |

DETAILED DESCRIPTION

To make the objectives, technical features, and advantages of the present application clearer and more understandable, the technical solutions according to the embodiments of the present application are further described in detail with reference to the accompany drawings. Apparently, the embodiments described herein are merely some exemplary ones, rather than all the embodiments of the present application. Based on the embodiments of the present application, all other embodiments derived by persons of ordinary skill in the art without any creative efforts shall fall within the protection scope of the present application.

Referring to FIG. 1 to FIG. 8, a chip packaging structure according to this embodiment includes: a substrate 1 and a plastic package 3; where the substrate 1 is provided with a trench, the trench being configured to accommodate a chip 2; the plastic package 3 is configured to cover an upper surface of the substrate 1 on which the chip 2 is disposed. An upper surface of the plastic package 3 is a flat surface; or the plastic package 3 is configured to cover a lower surface of the substrate 1 on which the chip 2 is disposed, and a lower surface of the plastic package 3 is a flat surface.

In the chip packaging structure according to this embodiment, the chip 2 is accommodated in the trench of the substrate 1 to decrease the thickness and volume of the chip packaging structure; and the plastic package 3 is provided on the surface of the substrate 1 on which the chip 2 is disposed to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved.

Specifically, the chip packaging structure is capable of achieving a securing, protection and the like effects on the chip 2. Securing of the chip 2 is in one aspect dependent on securing of the substrate 1, and in another aspect dependent on securing of the plastic package 3. For assurance of the structural strength of the chip packaging structure, it is required that the substrate 1 needs to have good hardness in addition to good processing properties. Optionally, the substrate 1 may be made of acryl, iron, copper or glass fiber. The substrate 1 made of these materials has good hardness.

Specifically, according to this embodiment, the chip 2 is disposed in the trench on the substrate 1, to decrease the thickness and volume of the chip packaging structure. It should be noted that the position of the trench and the structural form of the trench are not specifically limited, and may be determined according to the specific structure of the chip 2. Preferably, the trench is in the central region of the substrate 1, and the trench is a through trench which penetrates through the substrate 1. In this way, the chip 2 may be maximally disposed in the substrate 1, and the thickness and volume of the chip packaging structure may be reduced as much as possible. However, in practical application, the trench may be defined as partially penetrating through the substrate 1 and partially not penetrating through the substrate 1, or defined as a non-penetration structure according to practical needs, which is not limited in the embodiments of the present application. Optionally, after the chip 2 is accommodated, the upper surface of the chip 2 and the upper surface of the substrate 1 may be in the same horizontal plane; The lower surface of the chip 2 and the lower surface of the substrate 1 may be in the same horizontal plane. For example, the thickness of the chip 2 may be greater than, equal to, or less than the thickness of the substrate 1. When the chip 2 is assembled in the trench of the substrate 1, a surface of the chip 2 and a surface of the substrate 1 are made to be in the same horizontal plane as much as possible. As such, when the chip 2 is assembled on the substrate 1, whether the assembling of the chip 2 on the substrate 1 satisfies a design requirement is determined by determining whether the surfaces of the chip 2 and the substrate 1 are in the same horizontal plane. This, to some extent, facilitates rapid assembling of the chip 2 on the substrate 1 and also subsequent processing and manufacturing of the chip packaging structure. Still for example, in this embodiment, in terms of satisfying the defined requirement of the structural strength, the thickness of the substrate 1 may be selected from the range of 0.08 mm to 0.5 mm. When the chip is disposed in the substrate, the thickness of the chip module may be controlled to be about 0.24 mm, and the warpage of the chip module may be controlled to be in the range of 5 to 80 μm. When the chip module is applied to an identification module for identifying a biological feature, the thickness of the biological feature identification module may be controlled to be about 0.45 mm. In this way, the chip module satisfies the requirements of both small thickness and low-warpage.

It should be noted that a connection manner between the substrate 1 and the chip 2 is not specifically limited. Optionally, the substrate 1 is bonded to the accommodated chip 2 via a bonding layer. For example, during assembling, the substrate 1 and the chip 2 are firstly secured to a tooling, and the positions of the substrate 1 and the chip 2 are adjusted based on a design drawing of the chip packaging structure; after the adjustment, a gap is defined between the trench of the substrate 1 and the chip 2, and adhesive is applied into the gap; the bonding layer is formed after the adhesive is cured. The adhesive may be an underfill adhesive, an ultraviolet (UV) adhesive, an epoxy adhesive or a thermo-curable adhesive. Or an epoxy molding compound (EMC) can be injected into the gap, and the bonding layer is formed after the EMC is crosslinked and cured. According to this embodiment, by bonding the substrate 1 to the accommodated chip 2, the chip 1 is better secured. In addition, since the surroundings of the chip 2 are all bonded, the structural strength of the chip packaging structure is improved to some extent.

Apparently, by arranging the plastic package 3 on the chip packaging structure, the chip 2 and the substrate 1 are well protected, and the structural strength of the chip packaging structure with the chip 2 being accommodated in the trench is enhanced. For example, after the chip 2 is disposed in the trench on the substrate 1, the EMC is injected onto the upper surface of the substrate 1, and the EMC forms, through crosslinking and curing, the plastic package 3 that covers the upper surface of the substrate 1. Nevertheless, the EMC may also be injected onto the lower surface of the substrate 1, and the EMC forms, through crosslinking and curing, the plastic package 3 that covers the lower surface of the substrate 1. In addition, the EMC may also be injected onto both the upper surface and the lower surface of the substrate 1, and the EMC forms, through crosslinking and curing, the plastic package 3 that covers the upper surface and the lower surface of the substrate 1. It should be noted that the plastic package is not limited to the plastic package formed by the EMC through crosslinking and curing that is exemplified as above, and may be made of any suitable material having the plastic packaging function. Further, to improve the flatness of the chip packaging structure, in arranging the plastic package 3, the surface of the plastic package 3 should be made to form a flat surface. Specifically, the plastic package 3 is configured to cover the upper surface of the substrate 1 on which the chip 2 is accommodated, and the upper surface of the plastic package 3 is a flat surface; or the plastic package 3 is configured to cover the lower surface of the substrate 1 on which the chip 2 is accommodated, and the lower surface of the plastic package 3 is a flat surface.

Optionally, the substrate 1 is further provided with a first electrical connection structure connected to a peripheral circuit, where the first electrical connection structure is configured to be electrically connected to a second electrical connection structure arranged on the chip 2.

For example, the first electrical connection structure arranged on the substrate 1 may be a pin array that is connected to the peripheral circuit or a ball grid array 5 arranged on the substrate 1, which is not limited hereto. Using the ball grid array 5 as an example, as compared with the pin form, the ball grid array (BGA) 5 is favorable to ensuring the mechanical reliability of the entire chip module. For example, the ball grid array 5 is a pad arranged below the substrate 1.

Specifically, the chip according to this embodiment may be a chip processed by an ordinary technique, or may be a chip processed by a trenching technique, or may be a chip processed by a through silicon vias (TSV) technique, which is not limited hereto.

For example, when the chip 2 is a chip processed by the ordinary technique, the second electrical connection structure may be arranged on the upper surface or the lower surface of the chip 2, and the second electrical connection structure may be a die pad. In this case, the first electrical connection structure and the second electrical connection structure may be connected to each other via wire bonding. The specific implementation manner of the wire bonding may be referenced to the conventional implementation manner, which is not described herein any further. The wire bonding implements electrical interconnection between the chip and the substrate by using a thin metal line. Optionally, the metal line may be any one of a gold line, an aluminum line and a copper line, which is, however, not limited hereto.

For example, when the chip 2 is processed by the trenching technique, a trench 21 is formed on the chip 2, the second electrical connection structure may be arranged in the trench 21, and the second electrical connection structure may be a die pad. In this case, the first electrical connection structure and the second electrical connection structure may be connected to each other via bonding of a wire 4. The specific implementation manner of the wire bonding may be referenced to the conventional implementation manner, which is not described herein any further. According to this embodiment, by trenching of the chip, the thickness of the chip packaging structure may be further reduced; and after the trenching, the thickness of the chip packaging structure may not be increased even the wire bonding is employed.

It should be noted that the trench 21 may be formed at the upper part of the chip 2, or may be formed at the lower part of the chip 2, and one or a plurality of trenches 21 may be arranged. Further, when the trench 21 is formed at the upper part of the chip 2, the distance from the bottom surface of the trench 21 to the upper surface of the chip is defined as a predetermined distance; and when the trench is formed at the lower part of the chip 2, the distance from the bottom surface of the trench 21 to the lower surface of the chip 2 is defined as a predetermined distance. The predetermined distance is defined to maximally reduce the thickness of the chip packaging structure, which meanwhile may ensure that the stress suffered by the wire in the wire bonding causes no damage to the structure of the wire and thus the electrical performance of the chip module may not be affected. The predetermined difference threshold may be appropriately defined by a person skilled in the art according to practical needs, which is not limited in the embodiment of the present application.

For example, when the chip 2 is processed by the TSV technique, the through silicon via structure penetrates through the chip 2, and copper, tungsten, polycrystalline silicon or the like electrically conductive substance may be filled in the through silicon via. The through silicon via structure is the second electrical connection structure that is electrically connected to the first electrical connection structure on the substrate 1. The chip 2 processed by the TSV technique is capable of further reducing the thickness of the package structure of the chip 2 and the thickness of the module of the chip 2.

It should be noted that the first electrical connection structure and the second electrical connection structure may be directly electrically connected, or may be indirectly electrically connected. The direct electrical connection refers to that the first electrical connection structure and the second electrical connection structure are in direct contact with each other and thus electrically connected to each other, and the indirect electrical connection refers to that the first electrical connection structure and the second electrical connection structure are electrically connected to each other via an intermediate electrically conductive structure. For example, when the first electrical connection structure is the ball grid array 5 arranged below the substrate 1, the second electrical connection structure may be a die pad. In this case, the first electrical connection structure and the second electrical connection structure are distal from each other in terms of space, and may not be electrically connected to each other. In this case, a redistribution layer (RDL) may be arranged on the substrate 1 to implement the first electrical connection structure and the second electrical connection structure. Likewise, when the first electrical connection structure is the ball grid array 5 arranged below the substrate 1, the second electrical connection structure may be a through silicon via structure. In this case, the first electrical connection structure and the second electrical connection structure are distal from each other in terms of space, and may not be electrically connected to each other. In this case, an RDL may be arranged on the substrate 1 to implement the first electrical connection structure and the second electrical connection structure. The specific manner of arranging the RDL may be referenced to the conventional implementation manner, which is not described herein any further.

The chip packaging structures as illustrated in FIG. 1 to FIG. 8 are respectively described in detail hereinafter.

Figure 1:
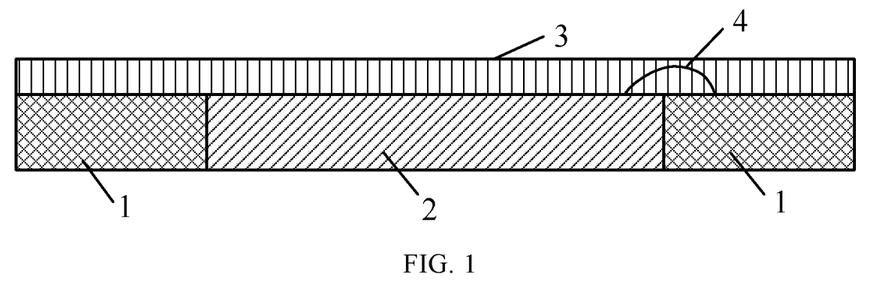
FIG. 1 is a schematic structural view of a chip packaging structure according to the first embodiment of the present application.
Figure 2:
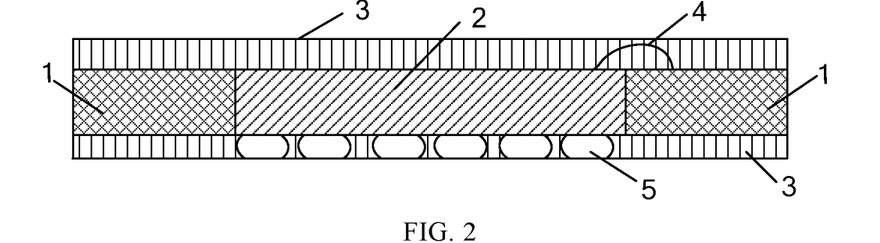
FIG. 2 is a schematic structural view of a chip packaging structure according to the second embodiment of the present application.

The chip packaging structures as illustrated in FIG. 1 and FIG. 2 include a trench penetrating through the substrate 1, where the trench is configured to accommodate the chip 2, and the chip 2 and the substrate 1 are connected by bonding of the wire 4. The first electrical connection structure on the substrate 1 may be a pin array, or may be a BGA 5, which is, however, not limited hereto. The chip 2 accommodated in the trench of the substrate 1 may be a chip 2 that is processed by the ordinary technique, and a die pad of the chip 2 may be arranged on the surface of the chip 2, and the die pad of the chip 2 is the second electrical connection structure of the chip 2. The first electrical connection structure and the second electrical connection structure may be connected by means of an RDL.

Specifically, in the chip packaging structure as illustrated in FIG. 1, a trench penetrating through the substrate 1 is arranged, the trench is configured to accommodate the chip 2, the plastic package 3 is arranged on the upper surface of the substrate 1, and the chip 2 and the substrate 1 are connected by wire bonding. The first electrical connection structure on the substrate 1 may be a pin array (not illustrated in the drawings), the chip 2 may be a chip 2 that is processed by the ordinary technique, the second electrical connection structure of the chip 2 may be a die pad of the chip 2 (not illustrated in the drawings), and the chip 2 and the substrate 1 are electrically connected by wire bonding. According to practical needs, the electrical connection between the die pad and the pin array may also be implemented by means of an RDL. Nevertheless, the first electrical connection structure on the substrate 1 is not limited to the pin array, and the second electrical connection structure of the chip 2 is not limited to the die pad of the chip 2. During assembling of the chip packaging structure, the substrate 1 and the chip 2 are firstly secured to a tooling, and the positions of the substrate 1 and the chip 2 are adjusted according to the design drawing; after the adjustment, a gap is defined between the trench on the substrate 1 and the chip 2, and adhesive is applied into the gap; the bonding layer is formed after the adhesive is cured, where the adhesive may be an underfill adhesive, a UV adhesive, an epoxy adhesive or a thermo-curable adhesive; or an EMC is injected into the gap, and the bonding layer is formed after the EMC is crosslinked and cured; afterwards, the wire 4 such as the metal wire is connected, where one end of the wire 4 is connected to the chip 2, and the other end of the wire 4 is connected to the substrate; and finally, the EMC is injected onto the upper surface of the substrate 1, and the plastic package 3 covering the upper surface of the substrate 1 is formed after the EMC is crosslinked and cured. It should be noted that since the plastic package 3 as illustrated in FIG. 1 is arranged on the upper surface of the substrate 1, during assembling of the packaging structure of the chip 2, the lower surface of the chip 2 and the lower surface of the substrate 1 are as much as possible made to be in the same horizontal plane to improve the flatness of the module of the entire chip 2, and further facilitate the subsequent assembling process. In the chip packaging structure according to this embodiment, the chip 2 is accommodated in the trench on the substrate 1 to decrease the thickness of the chip packaging structure and the packaging volume; and the plastic package 3 is configured on the surface of the substrate 1 on which the chip 2 is disposed to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved.

Specifically, in the chip packaging structure as illustrated in FIG. 2, a trench penetrating through the substrate 1 is provided, the trench is configured to accommodate the chip 2, the plastic package 3 is disposed on the upper surface and the lower surface of the substrate 1, and the chip 2 and the substrate 1 are connected by wire bonding. The first electrical connection structure on the substrate 1 may be a BGA 5, the chip 2 may be a chip 2 that is processed by the ordinary technique, the second electrical connection structure of the chip 2 may be a die pad of the chip 2 (not illustrated in the drawings), and the chip 2 and the substrate 1 are electrically connected by bonding of the wire 4. According to practical needs, the electrical connection between the die pad and the pin array may also be implemented by means of an RDL. Nevertheless, the first electrical connection structure on the substrate 1 is not limited to the BGA 5, and the second electrical connection structure of the chip 2 is not limited to the die pad of the chip 2. During assembling of the chip packaging structure, the substrate 1 and the chip 2 are firstly secured a tooling, and the positions of the substrate 1 and the chip 2 are adjusted according to the design drawing; after the adjustment, a gap is defined between the trench on the substrate 1 and the chip 2, and adhesive is applied into the gap; the bonding layer is formed after the adhesive is cured, where the adhesive may be an underfill adhesive, a UV adhesive, an epoxy adhesive or a thermo-curable adhesive; or an EMC is injected into the gap, and the bonding layer is formed after the EMC is crosslinked and cured; afterwards, the wire 4 such as the metal wire is connected, where one end of the wire 4 is connected to the chip 2, and the other end of the wire 4 is connected to the substrate; and finally, the EMC is injected onto the upper surface and the lower surface of the substrate 1, and the plastic package 3 covering the upper surface and the lower surface of the substrate 1 is formed after the EMC is crosslinked and cured. Based on the chip packaging structure as illustrated in FIG. 1, in the chip packaging structure as illustrated in FIG. 2, by means of the plastic package 3 that covers the upper surface and the lower surface of the substrate 1, the chip 2 and the substrate 1 are better protected, such that the chip module packaged by using the chip packaging structure has good contamination resistance and scratch resistance and the like. The first electrical connection structure on the substrate 1 in the chip packaging structure as illustrated in FIG. 2 is a BGA 5, which is favorable to ensuring the mechanical reliability of the entire chip module.

Figure 3:
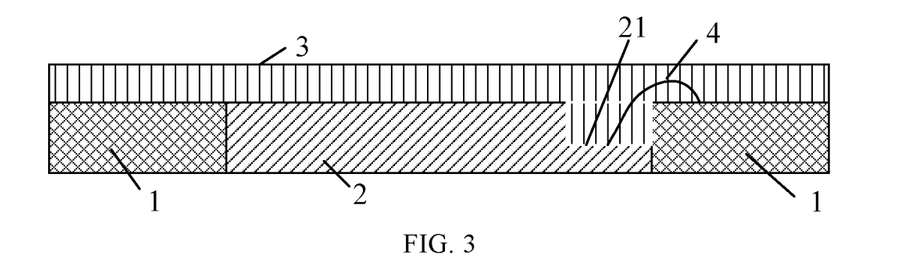
FIG. 3 is a schematic structural view of a chip packaging structure according to the third embodiment of the present application.
Figure 4:
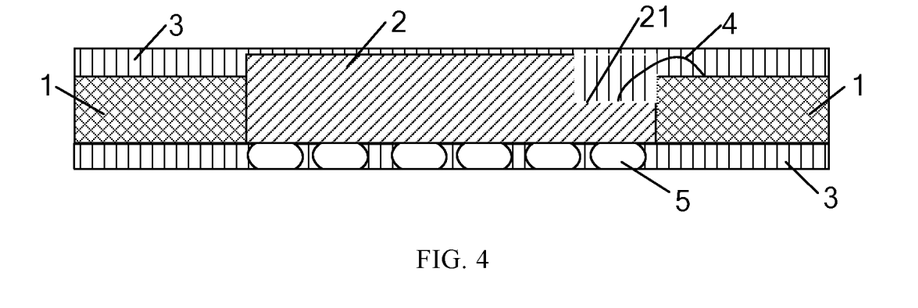
FIG. 4 is a schematic structural view of a chip packaging structure according to the fourth embodiment of the present application.
Figure 5:
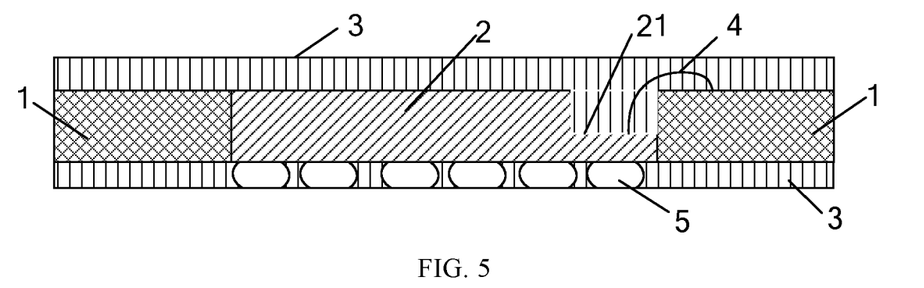
FIG. 5 is a schematic structural view of a chip packaging structure according to the fifth embodiment of the present application.

The chip packaging structures as illustrated in FIG. 3 to FIG. 5 include a trench penetrating through the substrate 1, where the trench is configured to accommodate the chip 2, and the chip 2 and the substrate 1 are connected by bonding of the wire 4. The first electrical connection structure on the substrate 1 may be a pin array, or may be a BGA 5, which is, however, not limited hereto. The chip 2 accommodated in the trench of the substrate 1 may be a chip 2 that is processed by the trenching technique, a trench 21 may be formed after the chip 2 is subjected to trenching, where the trench 21 may be provided with a die pad of the chip 2, and the die pad of the chip 2 is the second electrical connection structure of the chip 2. The first electrical connection structure and the second electrical connection structure may be connected by means of an RDL. In the chip packaging structures as illustrated in FIG. 3 to FIG. 5, a trench 21 is arranged on the chip 2, and the first electrical connection structure of the chip 2 is arranged in the trench 21. As compared with the chip packaging structures as illustrated in FIG. 1 and FIG. 2, the thickness and volume of the packaging structure of the chip 2 may be further reduced.

Specifically, in the chip packaging structure as illustrated in FIG. 3, a trench penetrating through the substrate 1 is arranged, the trench is configured to accommodate the chip 2, the plastic package 3 is arranged on the upper surface of the substrate 1, and the chip 2 and the substrate 1 are connected by wire bonding. The first electrical connection structure on the substrate 1 may be a pin array (not illustrated in the drawings), the chip 2 may be a chip 2 that is processed by the trenching technique, the second electrical connection structure of the chip 2 may be a die pad of the chip 2 (not illustrated in the drawings) and arranged in the trench 21 of the chip 2, and the chip 2 and the substrate 1 are electrically connected by bonding of the wire 4. According to practical needs, the electrical connection between the die pad and the pin array may also be implemented by means of an RDL. Nevertheless, the first electrical connection structure on the substrate 1 is not limited to the pin array, and the second electrical connection structure of the chip 2 is not limited to the die pad of the chip 2. During assembling of the chip packaging structure, the substrate 1 and the chip 2 are firstly secured to a tooling, and the positions of the substrate 1 and the chip 2 are adjusted according to the design drawing; after the adjustment, a gap is defined between the trench on the substrate 1 and the chip 2, and adhesive is applied into the gap; the bonding layer is formed after the adhesive is cured, where the adhesive may be an underfill adhesive, a UV adhesive, an epoxy adhesive or a thermo-curable adhesive; or an EMC is injected into the gap, and the bonding layer is formed after the EMC is crosslinked and cured; afterwards, the wire 4 such as the metal wire is connected, where one end of the wire 4 is connected to the chip 2, and the other end of the wire 4 is connected to the substrate; and finally, the EMC is injected onto the upper surface of the substrate 1, and the plastic package 3 covering the upper surface of the substrate 1 is formed after the EMC is crosslinked and cured. It should be noted that since the plastic package 3 as illustrated in FIG. 1 is arranged on the upper surface of the substrate 1, during assembling of the packaging structure of the chip 2, the lower surface of the chip 2 and the lower surface of the substrate 3 are as much as possible made to be in the same horizontal plane to improve the flatness of the entire chip module, and further facilitate the subsequent assembling process. In the chip packaging structure according to this embodiment, the chip 2 is processed by the TSV technique to accommodate the second electrical connection structure of the chip 2 in the trench 21 and accommodate the chip 2 in the trench of the substrate 1, such that the thickness of the chip packaging structure and the packaging volume are reduced; and the plastic package 3 is provided on the upper surface of the substrate 1 on which the chip 2 is accommodated to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved.

Specifically, in the chip packaging structure as illustrated in FIG. 4, a trench penetrating through the substrate 1 is arranged, the trench is configured to accommodate the chip 2, the plastic package 3 is arranged on the lower surface of the substrate 1, and the chip 2 and the substrate 1 are connected by wire bonding. The first electrical connection structure on the substrate 1 may be a BGA 5, the chip 2 may be a chip 2 that is processed by the trenching technique, the second electrical connection structure of the chip 2 may be a die pad (not illustrated in the drawings) and arranged in the trench 21 of the chip 2, and the chip 2 and the substrate 1 are electrically connected by bonding of the wire 4. According to practical needs, the electrical connection between the die pad of the chip 2 and the BGA 5 may also be implemented by means of an RDL. Nevertheless, the first electrical connection structure on the substrate 1 is not limited to the BGA 5, and the second electrical connection structure of the chip 2 is not limited to the die pad of the chip 2. During assembling of the chip packaging structure, the substrate 1 and the chip 2 are firstly secured to a tooling, and the positions of the substrate 1 and the chip 2 are adjusted according to the design drawing; after the adjustment, a gap is defined between the trench on the substrate 1 and the chip 2, and adhesive is applied into the gap; the bonding layer is formed after the adhesive is cured, where the adhesive may be an underfill adhesive, a UV adhesive, an epoxy adhesive or a thermo-curable adhesive; or an EMC is injected into the gap, and the bonding layer is formed after the EMC is crosslinked and cured; afterwards, the wire 4 such as the metal wire is connected, where one end of the wire 4 is connected to the chip 2, and the other end of the wire 4 is connected to the substrate; and finally, the EMC is injected onto the lower surface of the substrate 1, and the plastic package 3 covering the lower surface of the substrate 1 is formed after the EMC is crosslinked and cured. It should be noted that a layer of the plastic package 3 having a small thickness is arranged on the upper surface of the substrate 1 to fill the trench 21. In the chip packaging structure according to this embodiment, the chip 2 is processed by the TSV technique to accommodate the second electrical connection structure of the chip 2 in the trench 21 and accommodate the chip 2 in the trench of the substrate 1, such that the thickness of the chip packaging structure and the packaging volume are reduced; and the plastic package 3 is configured on the lower surface of the substrate 1 on which the chip 2 is disposed to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved. In addition, in the chip packaging structure as illustrated in FIG. 4, the first electrical connection structure on the substrate 1 is a BGA 5, which is favorable to ensuring the mechanical reliability of the entire chip module.

Specifically, in the chip packaging structure as illustrated in FIG. 5, a trench penetrating through the substrate 1 is arranged, the trench is configured to accommodate the chip 2, the plastic package 3 is arranged on the upper surface and the lower surface of the substrate 1, and the chip 2 and the substrate 1 are connected by wire bonding. The first electrical connection structure on the substrate 1 may be a BGA 5, the chip 2 may be a chip 2 that is processed by the trenching technique, the second electrical connection structure of the chip 2 may be a die pad of the chip 2 (not illustrated in the drawings) and arranged in the trench 21 of the chip 2, and the chip 2 and the substrate 1 are electrically connected by wire bonding. According to practical needs, the electrical connection between the die pad of the chip 2 and the BGA 5 may also be implemented by means of an RDL. Nevertheless, the first electrical connection structure on the substrate 1 is not limited to the BGA 5, and the second electrical connection structure of the chip 2 is not limited to the die pad of the chip 2.

During assembling of the chip packaging structure, the substrate 1 and the chip 2 are firstly secured to a tooling, and the positions of the substrate 1 and the chip 2 are adjusted according to the design drawing; after the adjustment, a gap is defined between the trench on the substrate 1 and the chip 2, and adhesive is applied into the gap; the bonding layer is formed after the adhesive is cured, where the adhesive may be an underfill adhesive, a UV adhesive, an epoxy adhesive or a thermo-curable adhesive; and an EMC is injected into the gap, and the bonding layer is formed after the EMC is crosslinked and cured; afterwards, the wire 4 such as the metal wire is connected, where one end of the wire 4 is connected to the chip 2, and the other end of the wire 4 is connected to the substrate; and finally, the EMC is injected onto the upper surface and the lower surface of the substrate 1, and the plastic package 3 covering the upper surface and the lower surface of the substrate 1 is formed after the EMC is crosslinked and cured. Based on the chip packaging structures as illustrated in FIG. 3 and FIG. 4, in the chip packaging structure as illustrated in FIG. 5, by means of the plastic package 3 that covers the upper surface and the lower surface of the substrate 1, the chip 2 and the substrate 1 are better protected, such that the chip module packaged by using the chip packaging structure has good contamination resistance and scratch resistance and the like. The first electrical connection structure on the substrate 1 in the chip packaging structure as illustrated in FIG. 5 is a BGA 5, which is favorable to ensuring the mechanical reliability of the entire chip module.

Figure 6:
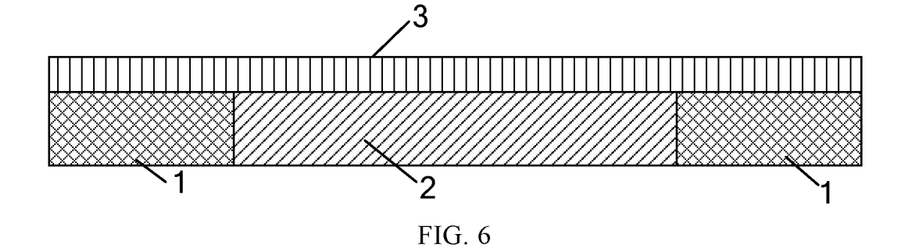
FIG. 6 is a schematic structural view of a chip packaging structure according to the sixth embodiment of the present application.
Figure 7:
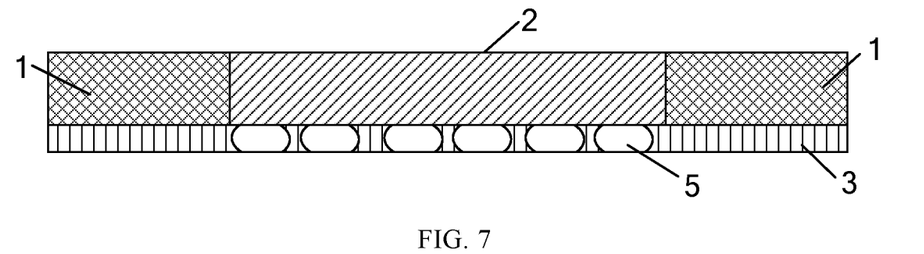
FIG. 7 is a schematic structural view of a chip packaging structure according to the seventh embodiment of the present application.
Figure 8:
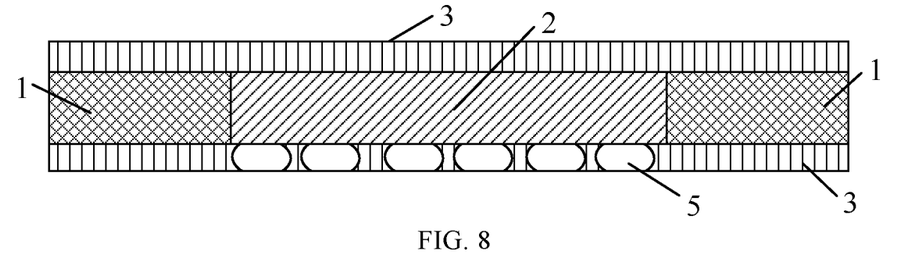
FIG. 8 is a schematic structural view of a chip packaging structure according to the eighth embodiment of the present application.

The chip packaging structures as illustrated in FIG. 6 to FIG. 8 includes a trench penetrating through the substrate 1, where the trench is configured to accommodate the chip 2. The first electrical connection structure on the substrate 1 is a pin array or a BGA 5, which is, however, not limited hereto; and the chip 2 is a chip 2 that is processed by the TSV technique, and a TSV structure (not illustrated in the drawings) penetrates through the chip 2, where the TSV structure is the second electrical connection structure of the chip 2. The first electrical connection structure and the second electrical connection structure may be connected by means of an RDL. In the chip packaging structures as illustrated in FIG. 6 to FIG. 8, the chip 2 that is processed by the TSV technique is used, and it is unnecessary to arranged a die pad on the chip 2 and configure the wire 4 for wire bonding, such that the mounting space is saved, and the thickness of the chip packaging structure and the thickness of the module of the chip 2 are further reduced.

Specifically, in the chip packaging structure as illustrated in FIG. 6, a trench penetrating through the substrate 1 is arranged, the trench is configured to accommodate the chip 2, the plastic package 3 is arranged on the upper surface and the lower surface of the substrate 1. The first electrical connection structure on the substrate 1 is a pin array (not illustrated in the drawings), the chip 2 is a chip 2 that is processed by the TSV technique, and a TSV structure (not illustrated in the drawings) penetrates through the chip 2, where the TSV structure is the second electrical connection structure of the chip 2. According to practical needs, the electrical connection the TSV structure and the pin array may be implemented by means of an RDL. Nevertheless, the first electrical connection structure on the substrate 1 is not limited to the pin array. During assembling of the chip packaging structure, the substrate 1 and the chip 2 are firstly secured to a tooling, and the positions of the substrate 1 and the chip 2 are adjusted based on the design drawing; after the adjustment, a gap is defined between the trench on the substrate 1 and the chip 2, and adhesive is applied to into the gap; the bonding layer is formed after the adhesive is cured, where the adhesive may be an underfill adhesive, a UV adhesive, an epoxy adhesive or a thermo-curable adhesive; or an EMC is injected into the gap; and afterwards, the EMC is injected onto the upper surface of the substrate 1, and the plastic package 3 covering the upper surface of the substrate 1 is formed after the EMC is crosslinked and cured. It should be noted that since the plastic package 6 as illustrated in FIG. 1 is arranged on the upper surface of the substrate 1, during assembling of the packaging structure of the chip 2, the lower surface of the chip 2 and the lower surface of the substrate 3 are as much as possible made to be in the same horizontal plane to improve the flatness of the entire chip module, and further facilitate the subsequent assembling process. In the chip packaging structure according to this embodiment, the chip 2 that is processed by the TSV technique is provided, and the chip 2 is accommodated in the trench of the substrate 1 to decrease the thickness of the chip packaging structure and the packaging volume; and the plastic package 3 is configured on the upper surface of the substrate 1 on which the chip 2 is disposed to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved.

Specifically, in the chip packaging structure as illustrated in FIG. 7, a trench penetrating through the substrate 1 is arranged, the trench is configured to accommodate the chip 2, the plastic package 3 is arranged on the lower surface and the lower surface of the substrate 1. The first electrical connection structure on the substrate 1 is a BGA 5, the chip 2 is a chip 2 that is processed by the TSV technique, and a TSV structure (not illustrated in the drawings) penetrates through the chip 2, where the TSV structure is the second electrical connection structure of the chip 2. According to practical needs, the electrical connection the TSV structure and the pin array may be implemented by means of an RDL. Nevertheless, the first electrical connection structure on the substrate 1 is not limited to the BGA 5. It should be noted that a tin ball pad is additionally arranged below the chip 2 that is processed by the TSV technique according to practical needs, where the pad is provided with a plurality of tin balls, the pad is electrically connected to the TSV structure via the tin balls on the tin ball pad, and the electrical connection between the tin ball pad and the BGA 5 on the substrate is implemented by means of an RDL.

During assembling of the chip packaging structure, the substrate 1 and the chip 2 are firstly secured to a tooling, and the positions of the substrate 1 and the chip 2 are adjusted based on the design drawing; after the adjustment, a gap is defined between the trench on the substrate 1 and the chip 2, and adhesive is applied to into the gap; the bonding layer is formed after the adhesive is cured, where the adhesive may be an underfill adhesive, a UV adhesive, an epoxy adhesive or a thermo-curable adhesive; or an EMC is injected into the gap; and afterwards, the EMC is injected onto the lower surface of the substrate 1, and the plastic package 3 covering the lower surface of the substrate 1 is formed after the EMC is crosslinked and cured. It should be noted that since the plastic package 7 as illustrated in FIG. 1 is arranged on the lower surface of the substrate 1, during assembling of the packaging structure of the chip 2, the upper surface of the chip 2 and the upper surface of the substrate 3 are as much as possible made to be in the same horizontal plane to improve the flatness of the entire chip module, and further facilitate the subsequent assembling process. In the chip packaging structure according to this embodiment, the chip 2 that is processed by the TSV technique is provided, and the chip 2 is accommodated in the trench on the substrate 1 to decrease the thickness of the chip packaging structure and the packaging volume; and the plastic package 3 is disposed on the lower surface of the substrate 1 on which the chip 2 is disposed to plastically package the chip 2, which not only ensures the structural strength of the chip packaging structure, but also reduces the warpage that may be caused due to the decrease of the thickness of the chip packaging structure as much as possible. In addition, the surface of the plastic package 3 is treated to be a flat surface, such that the chip module has good flatness and the adaptability of the chip module is improved. In addition, in the chip packaging structure as illustrated in FIG. 7, the first electrical connection structure on the substrate 1 is a BGA 5, which is favorable to ensuring the mechanical reliability of the entire chip module.

Specifically, in the chip packaging structure as illustrated in FIG. 8, a trench penetrating through the substrate 1 is arranged, the trench is configured to accommodate the chip 2, the plastic package 3 is arranged on the upper surface of the substrate 1. The first electrical connection structure on the substrate 1 is a BGA 5, the chip 2 is a chip 2 that is processed by the TSV technique, and a TSV structure (not illustrated in the drawings) penetrates through the chip 2, where the TSV structure is the second electrical connection structure of the chip 2. According to practical needs, the electrical connection the TSV structure and the pin array may be implemented by means of an RDL. Nevertheless, the first electrical connection structure on the substrate 1 is not limited to the BGA 5. During assembling of the chip packaging structure, the substrate 1 and the chip 2 are firstly secured to a tooling, and the positions of the substrate 1 and the chip 2 are adjusted based on the design drawing; after the adjustment, a gap is defined between the trench on the substrate 1 and the chip 2, and adhesive is applied to into the gap; the bonding layer is formed after the adhesive is cured, where the adhesive may be an underfill adhesive, a UV adhesive, an epoxy adhesive or a thermo-curable adhesive; or an EMC is injected into the gap; afterwards, the EMC is injected onto the upper surface and the lower surface of the substrate 1, and the plastic package 3 covering the upper surface and the lower surface of the substrate 1 is formed after the EMC is crosslinked and cured. Based on the chip packaging structure as illustrated in FIG. 7, in the chip packaging structure as illustrated in FIG. 8, by using the plastic package 3 that covers the upper surface and the lower surface of the substrate 1, the chip 2 and the substrate 1 are better protected, such that the chip module packaged by using the chip packaging structure has good contamination resistance and scratch resistance and the like.

It should be noted that the number of pads, for example, BGAs 5 arranged below the substrate may be determined according to practical needs of the chip, and the number of pads in the drawings for the specification is only an exemplary value, which is not particularly limited.

An embodiment of the present application provides a chip module. The chip module includes: a chip and the chip packaging structure according to any one of the above embodiments of the present application; where the chip is accommodated in the trench on the substrate of the chip packaging structure. It should be noted that the structure, the functionality and the technical effect of the chip packaging structure are similar to those disclosed in the above embodiments, which are thus not described herein any further.

In the chip packaging structure of the chip module according to the embodiment of the present application, the substrate is accommodated in the trench on the substrate to decrease the thickness of the chip packaging structure and the volume of the package; and the plastic package is configured on the surface of the substrate on which the chip is disposed to plastically package the chip, which not only ensures the structural strength of the chip packaging structure, but also reduces the warpage that may be caused due to the decrease of the thickness of the chip packaging structure as much as possible. In addition, the surface of the plastic package is treated to be a flat surface, such that the chip module has good flatness and the adaptability of the chip module is improved.

An embodiment of the present application further provides an electronic terminal. The electronic terminal includes the chip module as described in any one of the above embodiments. It should be noted that the structure, the functionality and the technical effect of the chip module are similar to those disclosed in the above embodiments, which are thus not described herein any further.

The chip module of the electronic terminal according to embodiment of the present application includes a chip packaging structure. In the chip packaging structure, the chip is accommodated in the trench of the substrate to decrease the thickness and volume of the chip packaging structure; and the plastic package is provided on the surface of the substrate on which the chip is disposed to plastically package the chip, which not only ensures the structural strength of the chip packaging structure, but also reduces the warpage that may be caused due to the decrease of the thickness of the chip packaging structure as much as possible. In addition, the surface of the plastic package is treated to be a flat surface, such that the chip module has good flatness and the adaptability of the chip module is improved.

Although preferred embodiments of the present application are described, those skilled in the art may make modifications and variations to these embodiments based on the basic inventive concept of the present application. Therefore, the appended claims are interpreted as covering the preferred embodiments and all such modifications and variations falling within the protection scope of the embodiments of the present application. Apparently, a person skilled in the art may make various modifications and variations to the present application without departing from the spirit and principles of the present application. If such modifications and variations fall within the scope defined by the claims of the present application and equivalent technologies thereof, the present application is intended to cover such modifications and variations.

What is claimed is:

1. A chip module, comprising: a chip and a chip packaging structure; wherein
    the chip packaging structure comprises a substrate and a plastic package; the substrate is provided with a trench in which the chip is accommodated; the plastic package is configured to cover a lower surface of the substrate, and a lower surface of the plastic package is a flat surface; wherein the substrate is further provided with a ball grid array connected to a peripheral circuit outside the chip module, the ball grid array is electrically connected to a through silicon via arranged in the chip, and the ball grid array is arranged below the substrate and in contact with the chip and a lower surface of the ball grid array is flush with the lower surface of the plastic package.

2. An electronic terminal, comprising a chip module, wherein the chip module comprises a chip and a chip packaging structure;

wherein the chip packaging structure comprises a substrate and a plastic package; the substrate is provided with a trench in which the chip is accommodated the plastic package is configured to cover a lower surface of the substrate, and a lower surface of the plastic package is a flat surface; and wherein the substrate is further provided with a ball grid array connected to a peripheral circuit outside the chip module, the ball grid array is electrically connected to a through silicon via arranged in the chip, and the ball grid array is arranged below the substrate and in contact with the chip and a lower surface of the ball grid array is flush with the lower surface of the plastic package and a lower surface of the ball grid array is flush with the lower surface of the plastic package.

3. The chip module according to claim 1, wherein a lower surface of the chip and the lower surface of the substrate are in the same horizontal plane.

4. The chip module according to claim 1, wherein the plastic package is formed by an injected epoxy resin via a crosslinking curing reaction.

5. The chip module according to claim 1, wherein the substrate is bonded to the chip that is accommodated in the trench via a bonding layer.

6. The chip module according to claim 1, wherein the bonding layer is formed by an injected epoxy molding compound via a crosslinking curing reaction.

7. The chip module according to claim 1, wherein the substrate has a thickness of between 0.08 mm and 5 mm.

8. The chip module according to claim 1, wherein the plastic package is configured to cover an upper surface of the substrate, and the upper surface of the plastic package is a flat surface.

* * * * *